(12) United States Patent
Coglitore et al.

(10) Patent No.: US 7,123,477 B2
(45) Date of Patent: Oct. 17, 2006

(54) COMPUTER RACK COOLING SYSTEM

(75) Inventors: Giovanni Coglitore, Saratoga, CA (US); Nikolai Gallo, Menlo Park, CA (US); Jack Randall, Ben Lomond, CA (US)

(73) Assignee: Rackable Systems, Inc., Milpitas, CA (US)

( * ) Notice: Subject to any disclaimer, the term of this patent is extended or adjusted under 35 U.S.C. 154(b) by 69 days.

(21) Appl. No.: 10/815,422

(22) Filed: Mar. 31, 2004

(65) Prior Publication Data

US 2005/0219811 A1 Oct. 6, 2005

(51) Int. Cl.
*G06F 1/20* (2006.01)
*H05K 5/00* (2006.01)
*H05K 7/20* (2006.01)

(52) U.S. Cl. ....................... 361/687; 361/724
(58) Field of Classification Search ................ 361/687, 361/724
See application file for complete search history.

(56) References Cited

U.S. PATENT DOCUMENTS

| | | | |
|---|---|---|---|
| 1,853,428 | A | 4/1932 | Jackson |
| 4,644,443 | A | 2/1987 | Swensen et al. |
| 4,691,274 | A | 9/1987 | Matouk et al. |
| 4,702,154 | A | 10/1987 | Dodson |
| 4,728,160 | A | 3/1988 | Mondor et al. |
| 4,754,397 | A | 6/1988 | Varaiya et al. |
| 4,774,631 | A | 9/1988 | Okuyama et al. |
| 4,860,163 | A | 8/1989 | Sarath |
| 4,901,200 | A | 2/1990 | Mazura |
| 4,911,231 | A | 3/1990 | Horne et al. |
| 4,977,532 | A | 12/1990 | Borkowicz et al. |
| 5,101,320 | A | 3/1992 | Bhargava et al. |

(Continued)

FOREIGN PATENT DOCUMENTS

DE 3316978 A1 11/1984

(Continued)

OTHER PUBLICATIONS

Anonymous. "Cobalt RaQ2," at http://www.cobalt.com/products/pdfs/datasheet.raq2.pdf visited on Nov. 27, 2000. (2 pages).

(Continued)

*Primary Examiner*—Lynn D. Feild
*Assistant Examiner*—Ingrid Wright
(74) *Attorney, Agent, or Firm*—Morrison & Foerster LLP

(57) ABSTRACT

Computer systems and methods of operating a computer system are described. The computer system can include a computer rack; a first stack and a second stack provided in the computer rack, each stack comprising one or more computers; a first cooling plenum configured such that cooling air can flow between the computers in the first stack and the first cooling plenum; and a second cooling plenum configured such that cooling air can flow between the computers in the second stack and the second cooling plenum. The method of operating a plurality of computers may include providing a first and a second computer in a partial back-to-back relationship in the computer rack such that an overlapping portion of the back of the first computer faces an overlapping portion of the back of the second computer; passing cooling air through the first computer and out of an exposed portion of the back of the first computer and into a first cooling plenum or passing cooling air from the first cooling plenum into the first computer; and passing cooling air through the second computer and out of an exposed portion of the back of the second computer and into a second cooling plenum or passing cooling air from the second cooling plenum into the second computer.

19 Claims, 9 Drawing Sheets

U.S. PATENT DOCUMENTS

| | | | |
|---|---|---|---|
| 5,136,464 | A | 8/1992 | Ohmori |
| 5,216,579 | A | 6/1993 | Basara et al. |
| 5,227,957 | A | 7/1993 | Deters |
| 5,351,176 | A | 9/1994 | Smith et al. |
| 5,398,159 | A | 3/1995 | Andersson et al. |
| 5,398,161 | A | 3/1995 | Roy |
| 5,432,674 | A | 7/1995 | Hardt |
| 5,440,450 | A | 8/1995 | Lau et al. |
| 5,460,441 | A | 10/1995 | Hastings et al. |
| 5,505,533 | A | 4/1996 | Kammersqard et al. |
| 5,515,239 | A | 5/1996 | Kamerman et al. |
| 5,528,454 | A | 6/1996 | Niklos |
| 5,544,012 | A | 8/1996 | Koike |
| 5,587,877 | A | 12/1996 | Ryan et al. |
| 5,602,721 | A | 2/1997 | Slade et al. |
| 5,684,671 | A | 11/1997 | Hobbs et al. |
| 5,684,674 | A | 11/1997 | Yin |
| 5,691,883 | A | 11/1997 | Nelson |
| 5,726,866 | A | 3/1998 | Allen |
| 5,788,347 | A | 8/1998 | Rabinovitz |
| 5,793,608 | A | 8/1998 | Winick et al. |
| 5,796,580 | A | 8/1998 | Komatsu et al. |
| 5,800,258 | A | 9/1998 | Knoop et al. |
| 5,813,243 | A | 9/1998 | Johnson et al. |
| 5,822,182 | A | 10/1998 | Scholder et al. |
| 5,875,965 | A | 3/1999 | Lee |
| 5,896,273 | A | 4/1999 | Varghese et al. |
| 5,909,357 | A | 6/1999 | Orr |
| 5,947,570 | A | 9/1999 | Anderson et al. |
| 5,949,646 | A | 9/1999 | Lee et al. |
| 5,956,227 | A | 9/1999 | Kitaoka |
| 5,992,953 | A | 11/1999 | Rabinovitz |
| 6,000,464 | A | 12/1999 | Scafidi et al. |
| 6,018,456 | A | 1/2000 | Young et al. |
| 6,025,989 | A | 2/2000 | Ayd et al. |
| 6,078,503 | A | 6/2000 | Gallagher et al. |
| 6,088,224 | A | 7/2000 | Gallagher et al. |
| 6,098,131 | A | 8/2000 | Unger et al. |
| 6,106,687 | A | 8/2000 | Edelstein |
| 6,129,429 | A | 10/2000 | Hardt et al. |
| 6,134,667 | A | 10/2000 | Suzuki et al. |
| 6,141,213 | A | 10/2000 | Antonuccio et al. |
| 6,147,862 | A | 11/2000 | Ho |
| 6,185,098 | B1 | 2/2001 | Benavides |
| 6,195,262 | B1 | 2/2001 | Bodette et al. |
| 6,195,493 | B1 | 2/2001 | Bridges |
| 6,255,583 | B1 | 7/2001 | Johnson et al. |
| 6,259,605 | B1 | 7/2001 | Schmitt |
| 6,496,366 | B1 | 12/2002 | Coglitore et al. |
| 6,506,111 | B1 | 1/2003 | Sharp et al. |
| 6,643,123 | B1 | 11/2003 | Hartel et al. |
| 6,741,467 | B1 | 5/2004 | Coglitore et al. |
| 6,822,859 | B1 | 11/2004 | Coglitore et al. |
| 6,850,408 | B1 | 2/2005 | Coglitore et al. |
| 2002/0075656 | A1 | 6/2002 | Hastings et al. |
| 2002/0126449 | A1 | 9/2002 | Casebolt |
| 2002/0173266 | A1 | 11/2002 | Sharp et al. |
| 2002/0173267 | A1 | 11/2002 | Sharp et al. |
| 2003/0035268 | A1 | 2/2003 | Coglitore et al. |
| 2003/0133266 | A1 | 7/2003 | Behl et al. |
| 2004/0004813 | A1 | 1/2004 | Coglitore et al. |
| 2004/0070936 | A1 | 4/2004 | Coglitore et al. |
| 2005/0047098 | A1* | 3/2005 | Garnett et al. ............ 361/735 |
| 2005/0068716 | A1* | 3/2005 | Pereira ................. 361/624 |
| 2005/0168945 | A1 | 8/2005 | Coglitore |

FOREIGN PATENT DOCUMENTS

| | | |
|---|---|---|
| FR | 2 610 471 | 5/1988 |
| GB | 2124432 A | 2/1984 |

OTHER PUBLICATIONS

Anonymous. "Cobalt RaQ3," at http://www.cobalt.com/products/pdfs/datasheet.raq3.pdf visited on Nov. 27, 2000. (2 pages).

Anonymous. "Cobalt RaQ4," at http://www.cobalt.com/products/pdfs/datasheet.raq4.pdf visited on Nov. 27, 2000. (2 pages).

Anonymous. "SGI—O2 Workstation Product Overview," at http://www.sgi.com/02/overview.html visited on Sep. 8, 2000. (4 pages.).

Anonymous. (Mar. 10, 1988) "Silicon Graphics Unveils Dedicated, Entry-Level Hosting Solution," Press Release at http://www.sgi.com/newsroom/press_releases/1998/march/o2webserver_release.html visited on Jan. 6, 2000. (2 pages.).

Anonymous. "A Rack-Mountable Web Server for ISPs of All Sizes," at http://www.sgi.com/solutions/internet/rpoducts/rackmount.html first visited on Jan. 6, 2000. (4 pages.).

3Com Corporation. "NETBuilder II 3C6023 Token Ring Module," located at <http://www.all3com.com/cart/3c6023.html> last visited on May 9, 2003 (1 page).

3Com Corporation. "NETBuilder II 4-Slot Chassis," located at <http://www.all3com.com/cart/3c6000.html> last visited on May 9, 2003 (1 page).

3Com Corporation. "NETBuilder II 8-Slot Chassis," located at <http://www.all3com.com/cart/3c6001.html> last visited on May 9, 2003 (1 page).

3Com Corporation. "NETBuilder II CEC 12 Meg. Module PWA," located at <http://www.all3com.com/cart/3c6010.html> last visited on May 9, 2003 (1 page).

3Com Corporation. "NETBuilder II CEC 12 Meg. Module PWA," located at <http://www.all3com.com/cart/3c6010a.html> last visited on May 9, 2003 (1 page).

3Com Corporation. "NETBuilder II CEC 8MB Memory Expansion," located at <http://www.all3com.com/cart/3c6011.html> last visited on May 9, 2003 (1 page).

3Com Corporation. "NETBuilder II CEC-Star 20 MB Module," located at <http://www.all3com.com/cart/3c6012a.html> last visited on May 9, 2003 (1 page).

3Com Corporation. "NETBuilder II CEC-Star 20MB Module," located at <http://www.all3com.com/cart/3c6012html> last visited on May 9, 2003 (1 page).

3Com Corporation. "NETBuilder II DPE PLUS 80MB Module," located at <http://www.all3com.com/cart/3c6091a.html> last visited on May 9, 2003 (1 page).

3Com Corporation. "NETBuilder II Dual-Processor Engine 40 MB Module," located at <http://www.all3com.com/cart/3c6090.html> last visited on May 9, 2003 (1 page).

3Com Corporation. "NETBuilder II Dual-Processor Engine plus Module," located at <http://www.all3com.com/cart/3c6091.html> last visited on May 9, 2003 (1 page).

3Com Corporation. "NETBuilder II Ethernet Module, AUI or BNC," located at <http://www.all3com.com/cart/3c6021.html> last visited on May 9, 2003 (1 page).

3Com Corporation. "NETBuilder II Ethernet with AUI Module, No BNC," located at <http://www.all3com.com/cart/3c6062.html> visited on May 9, 2003 (1 page).

3Com Corporation. "NETBuilder II Fast Ethernet 100Base-FX Module - Fiber," located at <http://www.all3com.com/cart/3c6071.html> visited on May 9, 2003 (1 page).

3Com Corporation. "NETBuilder II Fast Ethernet 100Base-TX Module - RJ-45," located at <http://www.all3com.com/cart/3c6070.html> visited on May 9, 2003 (1 page).

3Com Corporation. "NETBuilder II FDDI SingleMode Module," located at <http://www.all3com.com/cart/3c6050a.html> visited on May 9, 2003 (1 page).

3Com Corporation. "NETBuilder II FDDlLink Module - Multimode-multimode," located at <http://www.all3com.com/cart/3c6055.html> visited on May 9, 2003 (1 page).

3Com Corporation. "NETBuilder II Flash for 8 Slot Extended Chassis," located at <http://www.all3com.com/cart/3c6082a.html> visited on May 9, 2003 (1 page).

3Com Corporation. "NETBuilder II HSS 3-Port RS-449 Module," located at <http://www.all3com.com/cart/3c6042.html> visited on May 9, 2003 (1 page).
3Com Corporation. "NETBuilder II HSS 4 Port WAN Module," located at <http://www.all3com.com/cart/3c6047.html> visited on May 9, 2003 (1 page).
3Com Corporation. "NETBuilder II HSS 4 Port WAN Module," located at <http://www.all3com.com/cart/3c6047a.html> vistied on May 9, 2003 (1 page).
3Com Corporation. "NETBuilder II HSS 8 Port BRI U Module," located at <http://www.all3com.com/cart/3c6045.html> visited on May 9, 2003 (1 page).
3Com Corporation. "NETBuilder II HSS G.703 Module," located at <http://www.all3com.com/cart/3c6025.html> visited on May 9, 2003 (1 page).
3Com Corporation. "NETBuilder II HSS RS-232 3 Port Module," located at <http://www.all3com.com/cart/3c6041a.html> visted on May 9, 2003 (1 page).
3Com Corporation. "NETBuilder II HSS RS-449 Module," located at <http://www.all3com.com/cart/3c6024.html> visited on May 9, 2003 (1 page).
3Com Corporation. "NETBuilder II HSS V.35 3 Port Module," located at <http://www.all3com.com/cart/3c6040.html> visited on May 9, 2003 (1 page).
3Com Corporation. "NETBuilder II HSSI Module - OC-1_T3-E3 and subrates," located at <http://www.all3com.com/cart/3c6028.html> visited on May 9, 2003 (1 page).
3Com Corporation. "NETBuilder II HSS-V.35.RS-232 Module," located at <http://www.all3com.com/cart/3c6022a.html> visited on May 9, 2003 (1 page).
3Com Corporation. "NETBuilder II MP ATMLink OC-3 Multimode Module," located at <http://www.all3com.com/cart/3c6075.html> visited on May 9, 2003 (1 page).
3Com Corporation. "NETBuilder II MP Ethernet 6 Port 10Base-FL Module," located at <http://www.all3com.com/cart/3c6061.html> visited on May 9, 2003 (1 page).
3Com Corporation. "NETBuilder II MP Ethernet 6 Port 10Base-T Module," located at <http://www.all3com.com/cart/3c6060.html> visited on May 9, 2003 (1 page).
3Com Corporation. "NETBuilder II MultiMode FDDI module set," located at <http://www.all3com.com/cart/3c6020b.html> visited on May 9, 2003 (1 page).
3Com Corporation. "NETBuilder II MultiMode FDDI module set," located at <http://www.all3com.com/cart/3c6020.html> visited on May 9, 2003 (1 page).
3Com Corporation. "NETBuilder II PWA Flash Floppy Board for NetBuilder II 3C6081A," located at <http://www.all3com.com/cart/3c6027a.html> visited on May 9, 2003 (1 page).
3Com Corporation. "NETBuilder II V.35.RS-232 HSS Module," located at <http://www.all3com.com/cart/3c6022.html> visited on May 9, 2003 (1 page).
3Com Corporation. "NEW 3Com NETBuilder II EM AU 3C6062," located at <http://cgi.ebay.com/ws/eBayISAPI.dll?View Item &item=3045649846&category=11184> visited on Sep. 8, 2003 (1 page).
3Com Corporation. (1997). Title Unknown. Chapters 27-70, Appendices A-B, 416 pages.
3Com Corporation. (1997). Title Unknown. Chapters 31-54, Appendices A-R, 636 pages.
3Com Corporation. (Aug. 1994). "NETBuilder II® High-Speed Serial RS-449/X.21 3-Port Module Installation Guide", 23 pages.
3Com Corporation. (Aug. 1996). "NETBuilder II® HSS RS-232 3-Port DCE/DTE Module Installation Guide," 25 pages.
3Com Corporation. (Aug. 1997). "Installing the NETBuilder II® Dual Processor Engine Module," 33 pages.
3Com Corporation. (Date Unknown). "Discontinued Products List NetBuilder- (NETBuilder II, SSIINBSI, SSIINB, OCNB, NBRO)," 8 pages total.
3Com Corporation. (Date Unknown). "NETBuilder II Intelligent Routers," *NETBuilder* , 8 pages.
3Com Corporation. (Date Unknown). "DTE-to-DCE Adapter Release Notes," 2 pages.

3Com Corporation. (Date Unknown). "Installing the NETBuilder II Dual Processor Engine Module IMAGE," located at <http://www.all3com.com/cart/img/3c6090_zoom.jpg> visited on May 9, 2003 (2 pages).
3Com Corporation. (Date Unknown). "Installing the NETBuilder II Dual Processor Engine Module IMAGE," located at <http://www.all3com.com/cart/img/3c6091_zoom.jpg> visited on May 9, 2003 (2 pages).
3Com Corporation. (Dec. 1993). "NETBuilder II Dual Power Supply System Installation Guide," 26 pages.
3Com Corporation. (Dec. 1993). "NETBuilder II Dual Power Supply System Installation Guide," 61 pages.
3Com Corporation. (Dec. 1996). "NETBuilder II® Flash Memory Drive Installation Guide", 42 pages.
3Com Corporation. (Feb. 1994). "NETBuilder II® HSSI Module Installation Guide Release Notes", 35 pages.
3Com Corporation. (Jan. 1993). "NETBuilder II® High-Speed Serial V.35/RS-232 Module Installation Guide", 23 pages.
3Com Corporation. (Jan. 1994). "NETBuilder II Base System Installation Guide Release Notes", 4 pages.
3Com Corporation. (Jan. 1994). "NETBuilder II® HSSI Module Installation Guide", 28 pages.
3Com Corporation. (Jan. 1998). "Installing the NETBuilder II® HSS 4-Port WAN Module", 19 pages.
3Com Corporation. (Jan. 1998). "NETBuilder II® HSS 4-Port WAN Module Software Release Notes: Software Version 10.3", 13 pages.
3Com Corporation. (Jan. 1998). "NETBuilder II® HSS 4-Port WAN Module Software Release Notes-Software Version 10.3", 12 pages.
3Com Corporation. (Jul. 1995). "NETBuilder II® MP Ethernet 6-Port 10BASE-T and 10BASE-FL Module Installation Guide", 19 pages.
3Com Corporation. (Jun. 1995). "NETBuilder II® Fast Ethernet 100BASE-TX/100BASE-FX Module Installation Guide", 25 pages.
3Com Corporation. (Jun. 1996). "NETBuilder II® Communications Engine Card (CEC20) Module Installation Guide", 34 pages.
3Com Corporation. (Jun. 1996). "NETBuilder II® Communications Engine Card (CEC20) Module Installation Guide", 29 pages.
3Com Corporation. (Mar. 1992). "NETBuilder II® Ethernet Module Installation Guide", 21 pages.
3Com Corporation. (Mar. 1993). "NETBuilder II® High-Speed Serial RS-449 Module Installation Guide", 24 pages.
3Com Corporation. (Mar. 1993). "NETBuilder II® High Speed Serial G.703 Module Installation Guide", 19 pages.
3Com Corporation. (Mar. 1995). "NETBuilder II® CEC Memory Expansion Installation Guide", 7 pages.
3Com Corporation. (May 1997). "Approved Flash Memory and DRAM for the NETBuilder II® DPe Module", 1 page.
3Com Corporation. (May 1997). "Installing the NETBuilder II® Bridge/Router: For EZ Built Systems and Base Chassis", 81 pages.
3Com Corporation. (May 1997). "Installing the NETBuilder II® Dual Processor Engine Module: For Models DPE 40 and DPE 80", 29 pages.
3Com Corporation. (May 1997). "NETBuilder II® Hardware Installation Guides", 12 pages.
3Com Corporation. (May 2003). "Installing the NETBuilder II Bridge/Router", 45 pages.
3Com Corporation. (Oct. 1997). "New Installation for NETBuilder II® Software: Software Version 10.1.", 70 pages.
3Com Corporation. "NETBuilder II HSS 8 Port BRI ST Module," located at <http://www.all3com.com/cart/3c6046.html> visited on May 9, 2003 (1 page).
Anderson, R.D. et al. (Feb. 1972). "Volatile Memory Data Retention," *IBM Technical Disclosure Bulletin*pp. 2712-2713, located <http://www.delphion.com/tdb?order=72C+00474>visited on Nov. 18, 2005 (2 pages).
Argento, C.W. et al. (Jun. 1996). "Forced Convection Air-Cooling of a Commerical Electronic Chassis: An Experimental and Computational Case Study," *IEEE Transactions on Components, Packaging, and Manufacturing Technology-Part A* 19(2):248-257.
Artecon, Inc. (Mar. 26, 1997). "Artecon Announces Industry's Highest Performing RAID System for Small Networks; LynxArray Series 3000 Offers Fault Tolerance, True Scalability, Hot-Swap Components," *Business Wire*(Press Release), 2 pages.

Author Unknown. (Jul. 26, 1999). "New Products," *Electronic Design*, 3 pages.

Baker, D.L. et al. (Jan. 1990). "Rack-Mounted Computer System," *IBM Technical Disclosure Bulletin*, pp. 258-259.

Bay Networks, Inc. (Date Unknown). "Bay Networks Accelar-Supports Management Module SM-BAY 1002", SPECTRUM Enterprise Manager, Device, Management, Cabletron Systems, 71 pages.

Bay Networks, Inc. (Dec. 1997). "Using the Accelar 1200/1250 Routing Switch", 80 pages.

Bay Networks, Inc. (Dec. 1997). "Release Notes for the Accelar 1000 Series Products-Release 1.0", 18 pages.

Bay Networks, Inc. (Jun. 1998). "Release Notes for the Accelar 1000 Series Products-Software Release 1.1.1", 60 pages.

Bay Networks, Inc. (Nov. 1997). "Accelar 1200 Routing Switch", Strategic Networks, 9 pages.

Bay Networks, Inc. (Sep. 1998). "Release Notes for the Accelar 1000 Series Products-Software Release 1.3", 56 pages.

Bay Networks, Inc. (Sep. 1998). "Using the Accelar 1200/1250 Routing Switch", 94 pages.

Brown et al. (Sep. 1989). "Accessible Interconnect for Rack-Mounted Processor Module-To-Module Logic Signal Communication," *IBM Technical Disclosure Bulletin*, pp. 276-277.

Cisco Systems, Inc. (Jan. 17, 1994). "News Release: Cisco Adds Four Remote Access Routers," News Release, 29 pages.

COL Computer Online, "HP ProCurve Routing Switch 9308M," located at <http://www.gotocol.com/hp9308m.html> visited on Mar. 6, 2006. (3 pages).

David Systems, Inc. (1988). *DAVID CO-NET Technical Reference Manual* David Systems, Inc.: Sunnyvale, CA, 162 pages.

David Systems, Inc. (Oct. 1984-Nov. 1986). "Selected Press Articles", David Systems, Inc.: Sunnyvale, CA, 133 pages.

Dax Systems, Inc. (Aug. 9, 1996). "Dax Systems Serves Up Rack Mount Solution for Intel Multi-processor," *Business Wire*(Press Release). 2 pages.

Electronic Technology Group, Inc. (Jul. 8, 1994). "ETG Announces Release of New Raidmaster Disk Array Subsystem," *PR Newswire* (Press Release), 2 pages.

European Telecommunication Standards Institute ed. (Jan. 1994). "Equipment Engineering (EE): European Telecommunication Standard for Equipment Practice Part 3: Engineering Requirements for Miscellaneous Racks and Cabinets," ETS 300 119-3. ETSI: Valbonne, France, pp. 1-17.

Fetters, D. (Feb. 8, 1999). "Cubix High-Density Server Leads the Way With Standout Management Software," *Network Computing*, pp. 84-92.

Fetters, D. (Mar. 22, 1999). "Need Some Space? Have a Server Rack Attack," *Network Computing*, pp. 90-91.

Grigonis, R. (Feb. 1997). Dialog® Search for "Getting Under The Hood," *Computer Telephony*pS10, 8 pages.

Kaiser, L. et al. (1989). "Noise Control on Computer and Business Equipment using Speed Controlled Blowers," *IEEE*2:114-117.

Markstein, H.W. (May 1996). "Cooling Electronic Equipment Enclosures," *Electronic Packaging & Production*, pp. 57-63.

Nortel Networks, Inc. (Oct. 1998). "News Release," located at <http://www.nortel.com/corporate/news/newsreleases/press_10-98.html> visited on Feb. 16, 2006 (10 pages total).

Nortel Networks, Inc. (Date Unknown). "Building SAP-Capable Networks-How To Turn Your Network Into A Competitive Advantage", White Paper, pp. 1-24.

Nortel Networks, Inc. (Mar. 1999). "Release Notes for the Accelar 1000 Series Products-Software Release 2.0", 39 pages.

Nortel Networks, Inc. (Mar. 1999). "Using the Accelar 1200/1250 Routing Switch", 96 pages.

Paturet, J. (May 1989). "Improved Cooling System for Rack-Mounted Equipment," *IBM Technical Disclosure Bulletin*, pp. 140-141, located at <http://www.delphion.com/tdbs/tdb?order=89A+60774>visited on Nov. 22, 2005.

Perlmutter, A. (Sep. 1959). "Uniform Cooling Air Flow During Computer Maintenance and Operation," *IRE Transactions on Component Parts*6(3):180-189.

Rezek, G. (Mar./Jun. 1966). "Suction vs. Pressure Forced Air Cooling-Part II," *IEEE Transactions on Parts, Materials and Packaging* 2(½):35-43.

Ross, G. (Feb. 1995). "Thermal Management in Racks and Cabinets," *Computer Packaging Technology* pp. 82-84.

Simons, R.E. (Dec. 1995). "The Evolution of IBM High Performance Cooling Technology," *IEEE Transactions on Components, Packaging, and Manufacturing Technology-Part A* 18(4):805-811.

Soliman, F.A. et al. (1992). "Software-Compensated Programmable Temperature Controller," *Int. J. Electronics* 73(1): 101-105.

The Tolly Group ed. (Mar. 1998). "Bay Networks Accelar 1200™ Routing Switch", The Tolly Group, pp. 1-6.

Wong, H. et al. (Dec. 1996). "Thermal Evaluation of PowerPC 620 Microprocessor in a Multiprocessor Computer," *IEEE Transactions and Components, Packaging and Manufacturing Technology-Part A* 19(4):469-477.

\* cited by examiner

COMPUTER RACK COOLING SYSTEM

BACKGROUND

As information technology has rapidly progressed in the past ten years, the role of computer network centers such as server farms and server clusters have became increasingly important to our society. The server farms provide efficient data storage and data distribution capability that supports a worldwide information infrastructure, which has come to dominate how we live and how we conduct our day to day business.

A server farm is a group or cluster of computers acting as servers and housed together in a single location. For example, a Web server farm may be either a Web site that has more than one server, or an Internet service provider that provides Web hosting services using multiple servers. In a business network, a server farm or cluster might perform such services as providing centralized access control, file access, printer sharing, and backup for workstation users.

To take advantage of economies of scale, the number of computers hosted in server farms has continued to grow over the past ten years. This has lead to an increasing need for space in which to house the network host units and a consolidation of spaces where they are located. Sites known as co-location sites where numerous networked computers find a home have emerged to meet this market demand. Space for the computers is typically rented at such sites. Rent calculations may be based on the overall space occupied, power consumption and bandwidth handled by the computers occupying the space. Because of the relationship between such factors, it will often be in favor of both a co-location site and computer service provider to maximize both the density and performance efficiency of the computers at a given site. By increasing the density at which computers may be packed into a given area, the service provider benefits as less space is required for a given number of computers; the co-location site benefits since the ultimate bandwidth available in association with the space available may be greatly increased.

Other less apparent benefits stem from conserving the space a host computer occupies. In many instances, it will be economically feasible to forestall the retirement of otherwise outdated host computers since the cost of the space they occupy is relatively lower, thereby justifying their continued service for a period of time. On the other hand, where it is preferred to only maintain the highest-end computers in service, the savings available by minimizing the size of such computers without hindering performance is quite clear. There exists a need for computer systems adapted for realizing these many advantages.

Typically, at a site where numerous computers are connected to a network, the computers are stacked in racks and arranged in repeating rows or cells. Access to the computers is necessary for servicing, upgrading hardware, loading software, attaching cables, switching power on and off, and so forth. The elimination of as much access space as is feasible can increase the density of computer systems that may be provided for a given square footage of area at a site. Consequently, there exists a need to eliminate extraneous access space while still maintaining the use of relatively inexpensive, standard (or more-or-less standard size) racks.

In the market today, a standard rack that is widely used measures roughly 19 inches wide, 30 inches deep and 74 inches high. In at least one co-location site, these racks are lined up in rows of roughly 10–30 units with access doors on each side of a rack. Access aisles are provided on both sides of the rows. Many of the racks are filled with cumbersome computers mounted on sliders which are attached through mounting holes provided in the front and back of the rack. Regardless of the chassis design of the computers (or lack thereof where computers are merely built on open trays with their components uncovered) and how they are mounted to the racks, data devices included in the computer are accessed from the front. Main board I/O's, other I/O's, power cords and such items are typically accessed from the back. It is this latter design aspect which not only results in inefficiency in the amount of access space required, but also in the frequent inefficiencies associated with having to administer services to both sides of a computer. Consequently, there exists a need for computers useable in a network setting that are accessible and fully serviceable from a single side.

As the number of computers in a server farm is increased, two competing factors come into play: consumption of floor space and heat/ventilation management. To increase the number of computers at a given server farm without increasing the density of the computers means one would need more space. As the cost of real estate continues to rise, especially in the urban areas where population density is high, there is a strong incentive to maximize the utilization of a given space. Furthermore, in some existing server farm facilities, there is no more space available for scaleable growth. In such a situation, in order to expand, one would have to absorb the cost of starting a new server farm.

Alternatively, one may try to increase the number of computers that are housed in a given space. In order to significantly increase the density of computers in a given space, one common solution has been to shrink the size of each individual computer in the rack. Another option is to decrease the space between the racks that are holding the stacks of computers.

However, as one increases the density of computers, problems associated with heat dissipation rises exponentially. One of the major causes of electronic component failure is overheating. High performance electronics such as CPUs generate substantial amounts of heat. Additionally, next generation processors and power supplies are emitting substantially more heat as computing requirements increases. Thereby placing further demands on effective heat dissipation. In order for computers to continue to operate properly, appropriate heat dissipation pathways must be provided. Because each computer contains thousands of heat producing electronic parts, as one increases the density of the computers, one must also address the difficult issues of providing proper cooling mechanisms to remove heat from the individual computer nodes and the clusters as a whole.

SUMMARY

A computer system is described. The computer system comprises: a computer rack; a first stack and a second stack provided in the computer rack, each stack comprising one or more computers; a first cooling plenum configured such that cooling air can flow between the computers in the first stack and the first cooling plenum; and a second cooling plenum configured such that cooling air can flow between the computers in the second stack and the second cooling plenum.

In accordance with other aspects, a computer system is provided, comprising: a computer rack comprising a first region configured to retain a first stack of computers and a second region configured to retain a second stack of computers adjacent to the first stack of computers such that a first cooling plenum is in fluidic communication with computers disposed in the first stack of computers and a second cooling plenum is in fluidic communication with computers disposed in the second stack of computers.

In accordance with yet other aspects, a method of operating a plurality of computers in a computer rack is provided, comprising: providing a first and a second computer in a partial back-to-back relationship in the computer rack such that an overlapping portion of the back of the first computer faces an overlapping portion of the back of the second computer; passing cooling air through the first computer and out of an exposed portion of the back of the first computer and into a first cooling plenum or passing cooling air from the first cooling plenum into the first computer; and passing cooling air through the second computer and out of an exposed portion of the back of the second computer and into a second cooling plenum or passing cooling air from the second cooling plenum into the second computer.

In accordance with yet other aspects, a computer system is provided, comprising: a support structure configured to support a first stack of computers and a second stack of computers in an offset back-to-back configuration.

Other features and aspects of the invention will become apparent from the following detailed description, taken in conjunction with the accompanying drawings which illustrate, by way of example, the features in accordance with embodiments of the invention. The summary is not intended to limit the scope of the invention, which is defined solely by the claims attached hereto.

In the following description, reference is made to the accompanying drawings which form a part thereof, and which illustrate several embodiments of the present invention. It is understood that other embodiments may be utilized and structural and operational changes may be made without departing from the scope of the present invention. The use of the same reference symbols in different drawings indicates similar or identical items.

DETAILED DESCRIPTION

Figure 1:
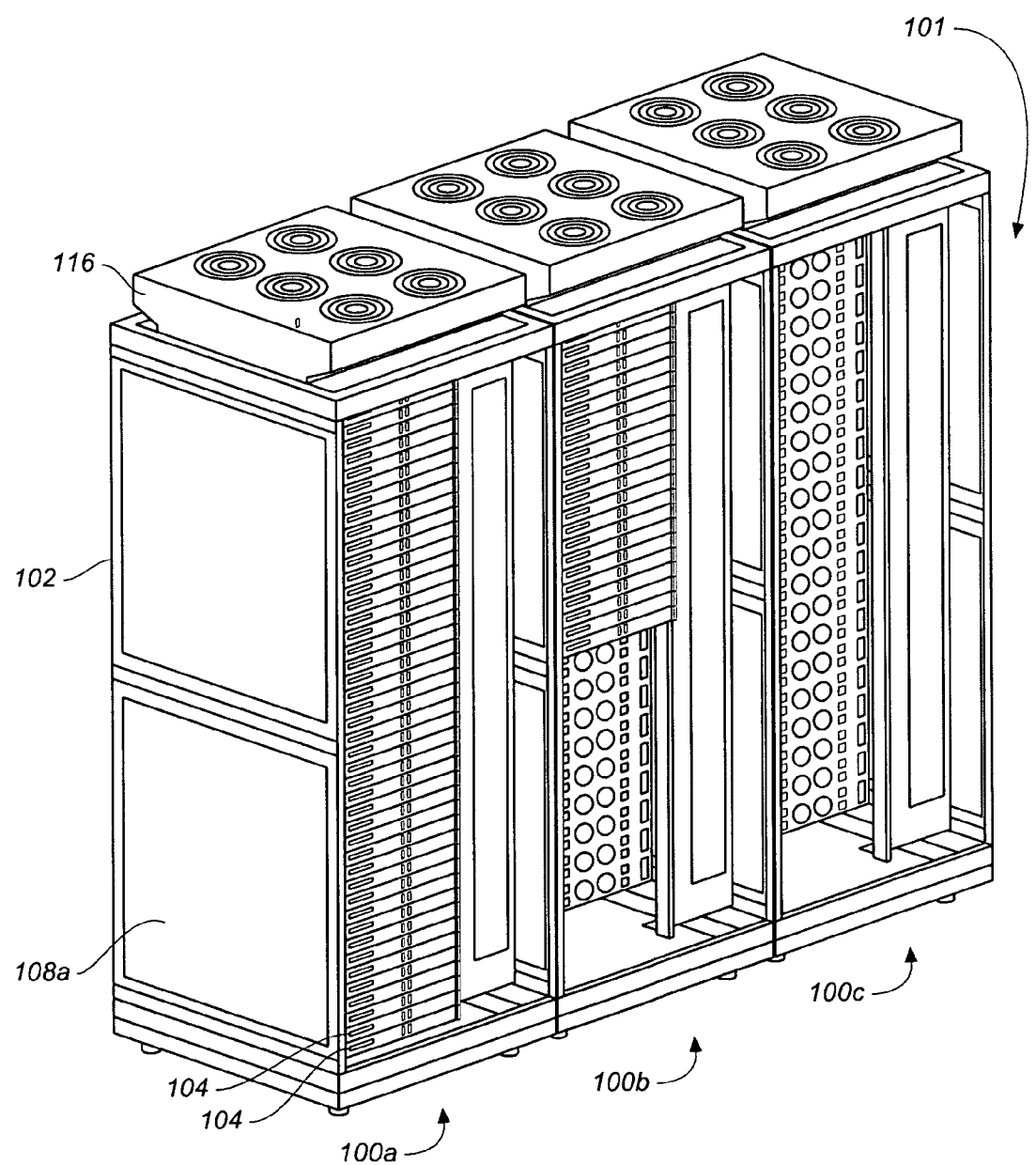
FIG. 1 is a perspective view of a plurality of computer systems in accordance with embodiments of the present invention.

FIG. 1 shows a perspective view of a row 101 of computer systems 100a–100c in accordance with embodiments of the present invention. Each computer system 100 includes a computer rack 102 which provides the structural support for the plurality of computers 104 provided in computer system 100 in a back-to-back, offset arrangement. The first computer system 100a is shown having a front side fully populated with computers 104, the second computer system 100b is shown having a front side partially populated with computers 104, and the third computer system 100a is shown having no computers 104 provided on the front side. The computer rack 102 may also be provided with enclosure walls and doors which cover the computers 104. Unlike conventional rack-based computer systems which only contain a single stack of computers, each computer system 100 includes two stacks of computers, as shown more clearly in FIG. 2. The computer rack 102 may comprise a standard-sized rack, or may have different dimensions. In one embodiment, the computer rack 102 measures approximately 24" wide, 40" deep, and 74" high.

The term "computer" is used herein to refer to any electronic system designed to perform computations and/or data processing. In some embodiments, a "computer" is an electronic device having a central processing unit (CPU) and memory provided on a main board. These components may be encased in a computer chassis. In some embodiments, the computer may comprise a printed circuit board (PCB) having exposed components without an enclosure.

Figure 2:
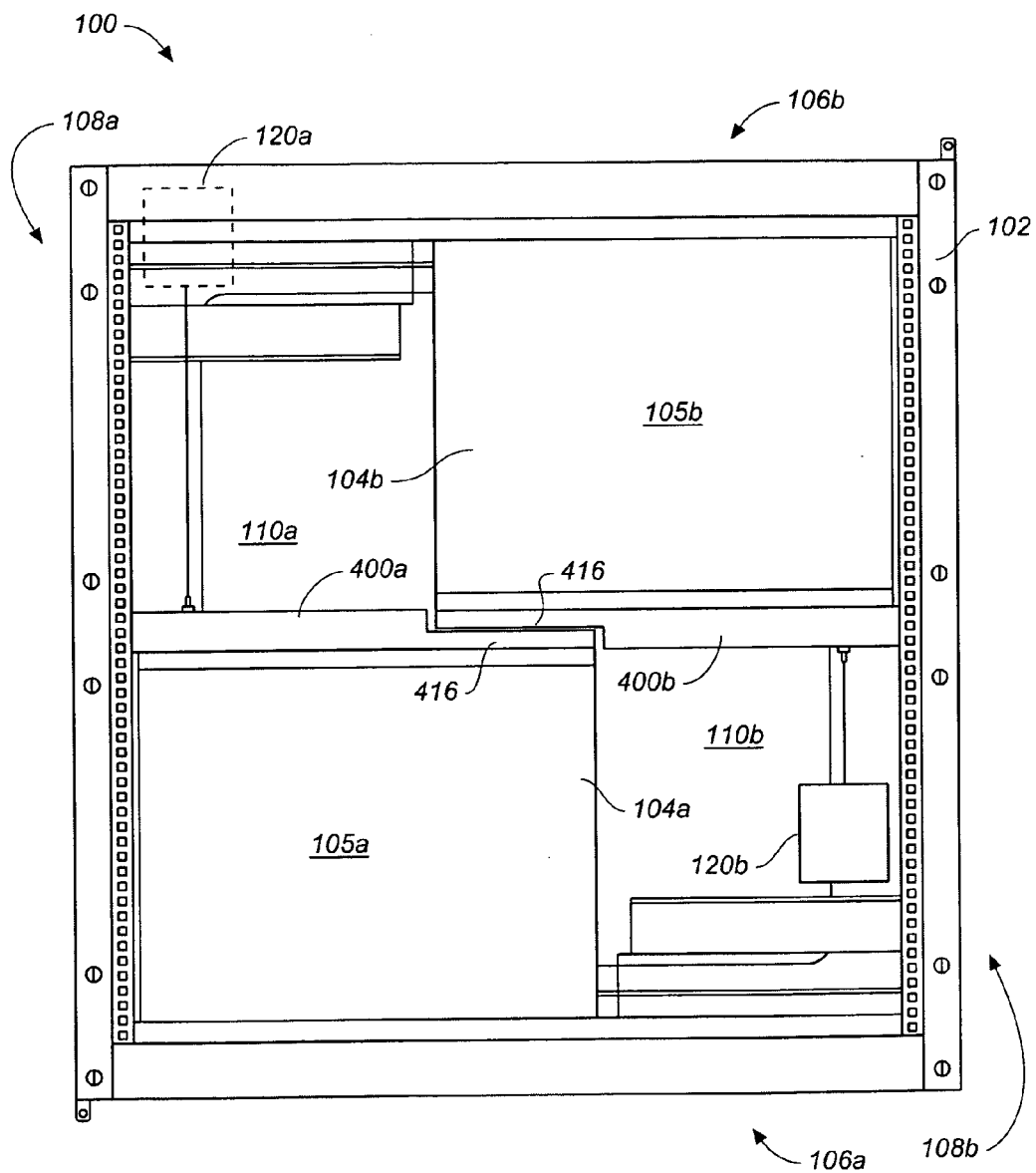
FIG. 2 is a top view of the interior of a computer system in accordance with embodiments of the present invention.
Figure 3:
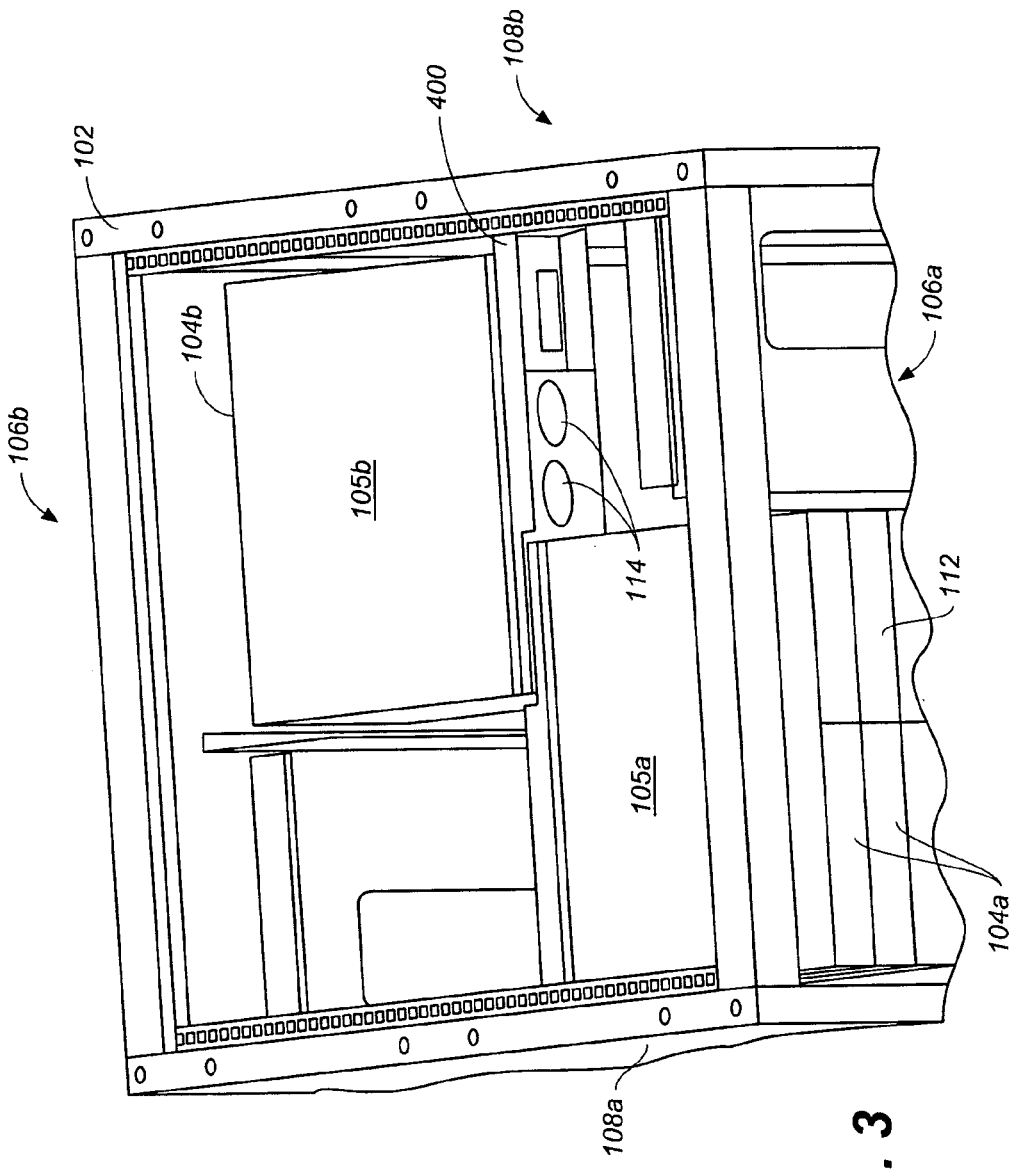
FIG. 3 is a perspective view of the interior of a computer system in accordance with embodiments of the present invention.

FIG. 2 is a top view of the computer system 100 and FIG. 3 is a perspective view of the computer system 100. FIGS. 2–3 illustrate more clearly a back-to-back, offset arrangement of computers 104 in accordance with embodiments of the present invention. The computer system 100 includes a first face side 106a and a second face side 106b, opposite the first face side 106a, and further includes a first lateral side 108a and a second lateral side 108b, opposite the first lateral side 108a. When multiple computer systems 100 are provided in a computer room, for example, the computer systems 100 are arranged such that the lateral side of each computer system 100 is faces the lateral side of the adjacent computer system 100 in the room. The face sides 106 of each computer system 100 are co-planar and form a row of face sides 106 accessible to the computer room operator as the operator walks along the row of computer systems 100.

As can be seen in FIGS. 2–3, the computer system 100 includes a first stack 105a and a second stack 105b of computers 104. Each stack 105 includes a plurality of computers 104 positioned in a vertical arrangement such that the sides of each computer 104 in the stack 105 are roughly co-planar. In addition, in the computer system 100 shown in FIGS. 2–3, the front sides of each computer 104 are provided along either the first face side 106a or the second face side 106b of the computer system 100. Thus, when a plurality of computer systems 100 are provided in a row, as shown in FIG. 1, an operator can walk along one side of the row of computer systems 100 and access the front sides of each computer 104a in the first stack 105a. Then, the operator can walk along the opposite side of the row of computer systems 100 and access the front sides of each computer 104b in the second stack 105b.

The back-to-back and offset (or partially overlapping) arrangement of the two stacks 105 of computers 104 create two cooling air plenums 110a–110b. Each of the plenums 110 shown in FIG. 2 have four sides. The first side of the plenum 110b is defined by one of the lateral sides of the computers 104a of the first stack 105a. The second side of plenum 100b is defined by the back sides of the computers 104b in the second stack 105b. The third side of the plenum 110b is defined by the second lateral side 108b of the computer system 100. The fourth side of the plenum 110b is defined by the first face side 106a of the computer system 100. The second plenum 110a is similarly defined.

At the top of the computer rack 102, support flanges 120a–120b may be provided to provide additional rigidity for the computer system 100. Adjacent the support flanges 120a–120b is a cabling region 122a–122b, which may be used to contain the various cable and connections used for the computer system 100.

Figure 4A:
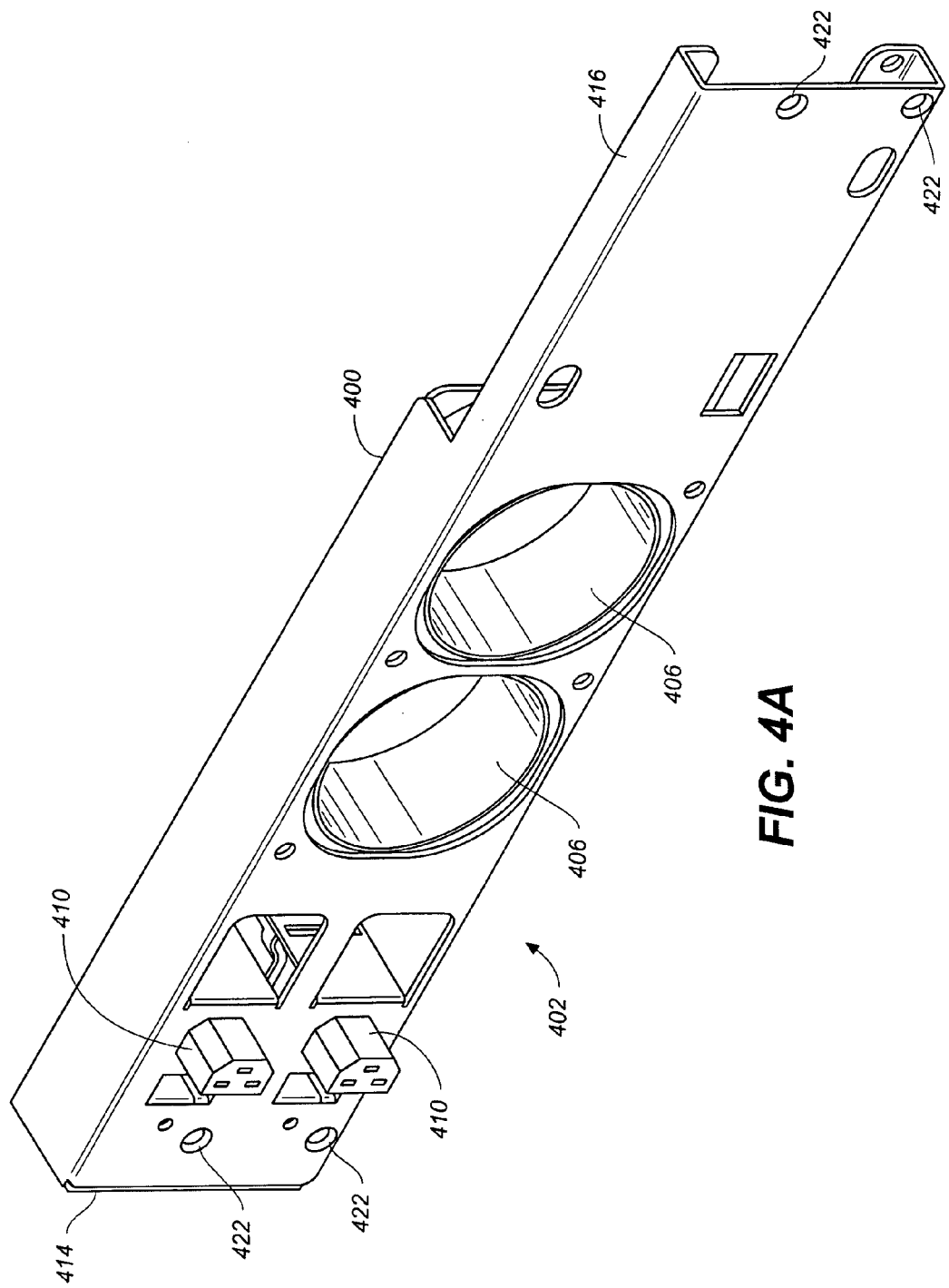
FIGS. 4A–4B are perspective front and back views of a bracket in accordance with embodiments of the present invention.
Figure 4B:
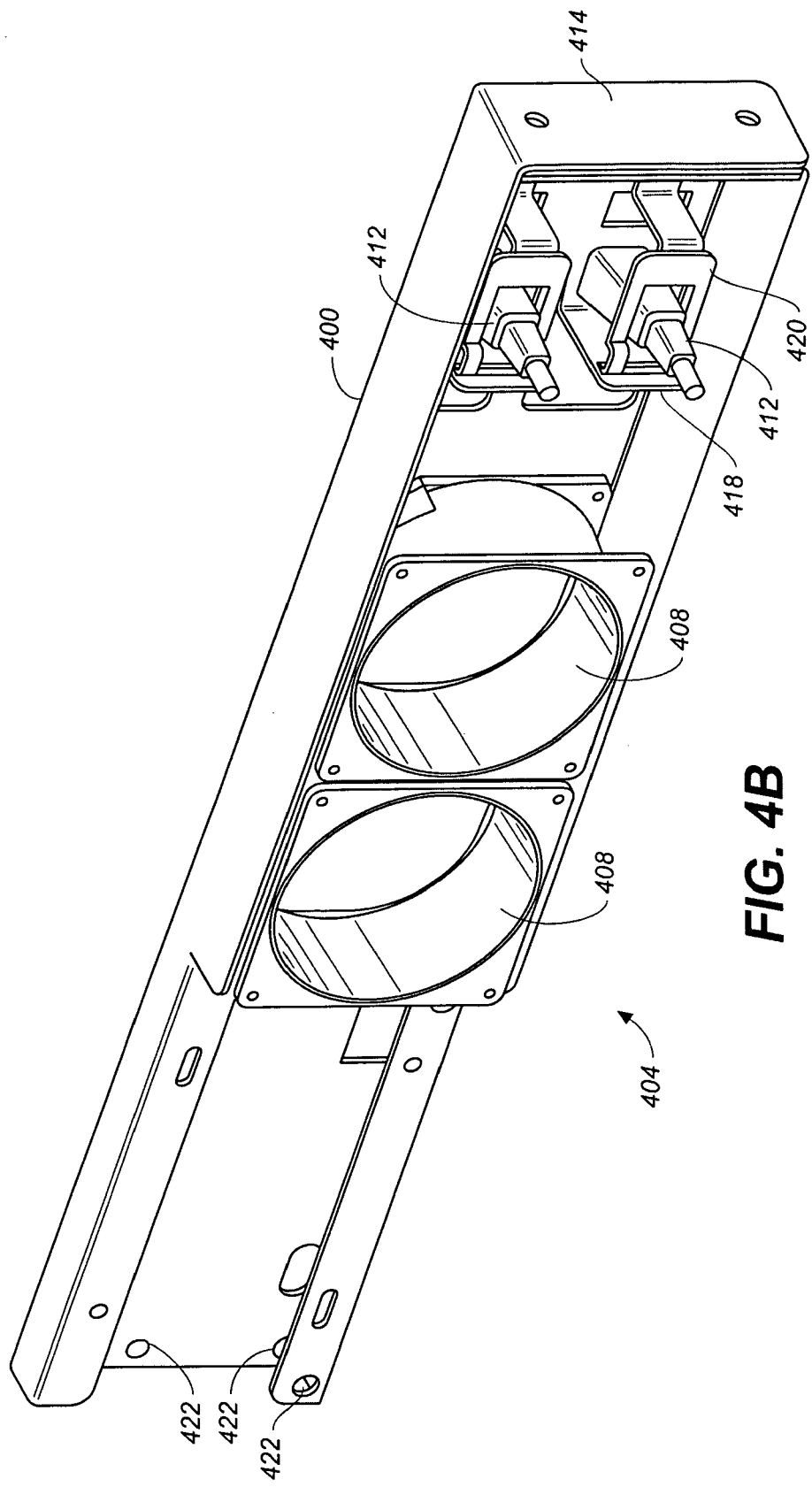

A bracket 400 may also be provided along the back sides of the computers 104 in each stack 105. An exemplary bracket 400 is shown in greater detail in FIGS. 4A–4B. The front side 402 of the bracket 400 is shown in FIG. 4A, and the back side 404 of the bracket 400 is shown in FIG. 4B. When the computer system 100 is assembled, the front side 402 is adjacent the back sides of the computers 104 and the back side 404 is exposed to the cooling air plenum 110.

Each of the brackets 400 may be configured to include a rack-mounted end 414 which attaches to a structural beam near the side of the computer rack 102 and a bracket-mounted end 416 which is coupled with the bracket-mounted end 416 of a corresponding bracket 400 which holds the fans for cooling the adjacent stack 105 of computers 104. As shown in FIG. 2, the bracket-mounted end 416 of bracket 400a is coupled with the bracket-mounted end 416 of bracket 400b. The rack-mounted ends 414 of the brackets 400a–400b are mounted to the lateral sides of the computer rack 102.

In accordance with embodiments of the present invention, the pair of brackets 400a–400b can cooperate to form a structural support for the computers 400. In the embodiment shown in FIG. 4A, each bracket includes support apertures 422 that are positioned to mate with support pins 423 protruding from the back side of the computers 400 (as shown in FIG. 8B). When each computer 400 is mounted in the computer rack 102, the support pins 423 are inserted into the support apertures 422 to provided support for the back side of the computer 400. Support apertures 424 may be provided on the front side of the computer 400, to enable the front side of the computer 400 to be attached to the rack 102 using, for example, screws. With this arrangement, it may be unnecessary to provide any additional supports in the rack 102 for the computers 400.

The bracket 400 may include one or more air apertures 406 for enabling cooling air to pass through the bracket 400 between the computers 104 and the cooling air plenums 110. When the computers 104 include a computer chassis enclosing the computer components, each computer 104 may include one or more vents for allowing air to flow from the interior region of the computer 104 through the air aperture 406 to the plenum 110. One or more air movers 408 (such as, e.g., fans) can be provided to assist with the airflow through the apertures 406. In FIG. 4B, simplified drawings of air movers 408 are depicted for clarity. These simplified drawings do not illustrate the fan blades, motors, or other components for moving the air, as would be understood by one of ordinary skill in the art.

In accordance with embodiments of the present invention, the bracket 400 may further include one or more power apertures 410 for enabling a power cable 412 (or other power connector) to pass through the bracket 400 to each of the computers 104. Each of these power apertures 410 may be positioned to be aligned with a power input connector on the computer 104 such that as the computer 104 is inserted into the computer rack 102 from the face side of the computer system 100, a power cable 412 positioned in the power aperture 410 will automatically mate with the corresponding power input connector on the computer 104 without further operator manipulation. This arrangement provides for easy power connection to power cables 412 provided in the middle of the computer rack 102, where it would otherwise be more difficult to manipulate if done by hand, due to its interior location.

The bracket 400 shown in FIGS. 4A–4B includes support flanges for retaining the power cables 412 in place. A first flange 418 is formed from a portion of the bracket 400 which is cut out and bent at a 90° angle. The second flange 420 is L-shaped and includes a portion which mates with the first flange 418 and a second portion which can be attached to the bracket body using screws. The second flange 420 abuts the back of the power cable 412 to inhibit rearward movement of the power cable 412 as the computer 104 is being inserted into the rack 104. This helps to ensure a secure and complete mating of the power cable 412 with the power input connector on the computer 104.

In some embodiments, one or more power supplies 120 can be mounted inside the computer rack 102 external to the computers 104. These power supplies 120 can provide power to each of the power cables 412, which, in turn, provide power to the computers 104. The air which flows through the cooling air plenums 110 can be used to cool the power supplies 120.

In FIG. 2, two locations of power supplies are shown. Power supply 120a supplies power to a computer 104 in the first stack 105a is may be provided adjacent to the second face side 106b of the computer system 100. This position may facilitate easier access to power supply 120a for servicing or replacement. In addition, the air directed into the first plenum 110a can flow from the plenum 110a through or over the power supply 120a and out of the computer system 100. Alternatively, the cooling air may be drawn into the power supply 120a from the exterior of the computer system 100, passed into the plenum 110a, and vented out of the top or bottom or both of the computer system 100.

In accordance with other embodiments of the invention, power supply 120b is positioned in another location within the computer system 100. In different embodiments, the position of the power supplies 120 may vary. In some embodiments, the power supply may be provided within each computer 104, and a power strip for routing power to each of the computers 104 may be provided at the location of the illustrated power supply 120a.

In accordance with an aspect of the present invention, the air movers 408 in each bracket 400 move air in or out of more than one computer 104. In the embodiment shown in FIG. 3, each computer 104 has a standard 1U form factor such that each computer has a height of approximately 1.75". Bracket 400 has a 2U height (i.e., approximately 3.5") so that each bracket 400 spans to two adjacent computers 104. Accordingly, each air aperture 406 and corresponding air mover 408 draws air from two adjacent computers 104 in the stack 105. The air movers 408 mounted on the bracket 400 may be used to replace the fans conventionally included in rack-mounted servers, or the air movers 408 may be used in addition to fans or other air movers positioned inside each computer 104.

Several advantages may be achieved by utilizing the illustrated air moving system. First, by positioning the air movers 108 (i.e., the fans) behind the computer 104, extra interior space inside the computer chassis may be made available for other components. In all rack-based computer systems, and particularly when dealing with small form-factor 1U systems, space inside of the computer chassis is extremely limited. By providing fans on the exterior of the computer chassis for drawing air out of (or for forcing air into) the computer chassis, the space inside of the computer chassis that would normally have been reserved for fans can be used for other components of the computer.

In addition, fans having a 1U profile have extremely small fan blades and, accordingly, have limited air moving ability. By utilizing a single fan spanning two computers 104, the fan blade diameter can be roughly doubled. This doubling of the fan blade diameter has an exponential affect on the fan-blade area and on the overall air-moving capacity of the fan. It has been observed in some installations that a pair of 2U-sized fans can provide the same air moving capability as ten 1U-sized fans. In addition, in other embodiments, a single bracket may span three or more computers. In these embodiments, each fan with draw cooling air from three or more adjacent computers. In yet other embodiments, seals or gaskets may be provided between the brackets 400 and the back sides of the computers 400, to better couple the air movers 108 with the interior regions of the computers 400 and thereby provide more efficient airflow.

When the computers 104 in the computer system 100 are operating, various components in each computer 104 generate heat. Two of the primary sources of heat within a typical server include the main CPU and the power supply. Additional heat-generating components include but are not limited to hard disk drives, integrated circuits on the chipset, and memory. In accordance with embodiments of the present invention, the heat being generated by these heat-generating components are drawn out of the computers 104 as described below and illustrated in flowcharts of FIGS. 5A–5B.

Figure 5A:
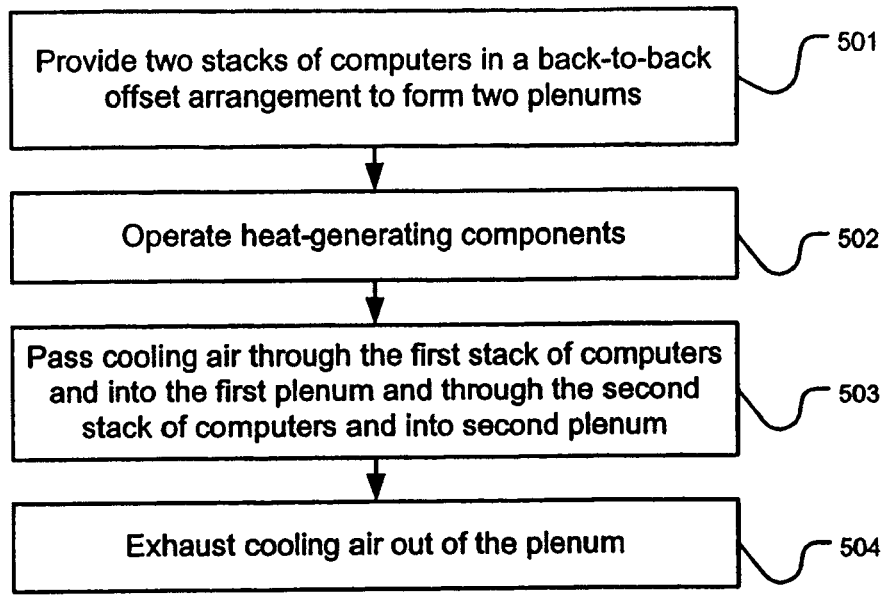
FIGS. 5A–5B are flowcharts showing cooling methods in accordance with embodiments of the present invention.

FIG. 5A is a flowchart of a computer system cooling method in accordance with embodiments of the present invention. In step 501, two stacks of computers are provided in a back-to-back, offset arrangement such that two cooling air plenums are formed. In step 502, heat-generating components of the computers are operated. In step 503, cooling air passes through the computers to draw heat from the heat-generating components and into the two cooling air plenums. The cooling air passing through the first stack of computers passes into the first cooling air plenum and the cooling air passing through the second stack of computers passes into the second cooling air plenum. In step 504, the cooling air in the plenum passes out of the computer system.

In the method illustrated in FIG. 5A, the cooling air can be provided by an air conditioning unit to the interior of the room in which the computer systems 100 are installed. With reference to the computer system 100 shown in FIGS. 1–3, the air movers 408 provided adjacent to the first stack 105a of computers 104a can be operated to draw air out of the computers 104a. This creates an airflow inside each of the computers 104a such that the cooling air in the room is drawn through vents 112 in the front of the computers 104s and into the interior of the computer chassis. As this cooling air passes over or around the heat-generating components in the computers 104a, the heat is absorbed by the cooling air, which then is drawn by the air movers 408 out of the computers 104a through vents 114 in the back of the computers 104a. This cooling air is then exhausted into the cooling air plenum 110a. In a similar fashion, cooling air is drawn through the second stack 105b of computers 104b and into the second cooling air plenum 110b. As mentioned above, fans may be provided inside of the computers 104b to effectuate this airflow.

This cooling air which has absorbed the heat from the heat-generating components is then exhausted out of the cooling air plenums 110a–110b. In one embodiment, the cooling air plenums 110a–110b are coupled to a vent hood 116 provided at the top of the computer system 100. This vent hood 116, in turn, can be coupled to ducts which channel the heated cooling air out of the location of the computer systems 100. Additional air movers may be provided in or near the vent hoods 116 for assisting in the flow of cooling air out of the plenums 110. The ducts can, for example, channel the air back to the air conditioning system or exhaust the air out of the building and into the environment. The vent hood 116 and the ducts can operate to keep the heated cooling air separate from the cooling air provided by the air conditioning system to cool the heat-generating components. This can increase cooling efficiency and prevent pockets of heat from being generated due to ineffective air flow.

In other embodiments, the cooling air in the plenums 110 can be directed downward into ducts provided underneath the computer systems 100. These ducts can direct the heated cooling air away from the computer systems and out of the building. Because many computer rooms are built on raised floors, the addition of cooling air ducts underneath the computer systems 100 can be easily accommodated. In yet other embodiments, the exhaust air may flow both up out of the top of the plenum 110 and down out of the bottom of the plenum 110.

Figure 5B:
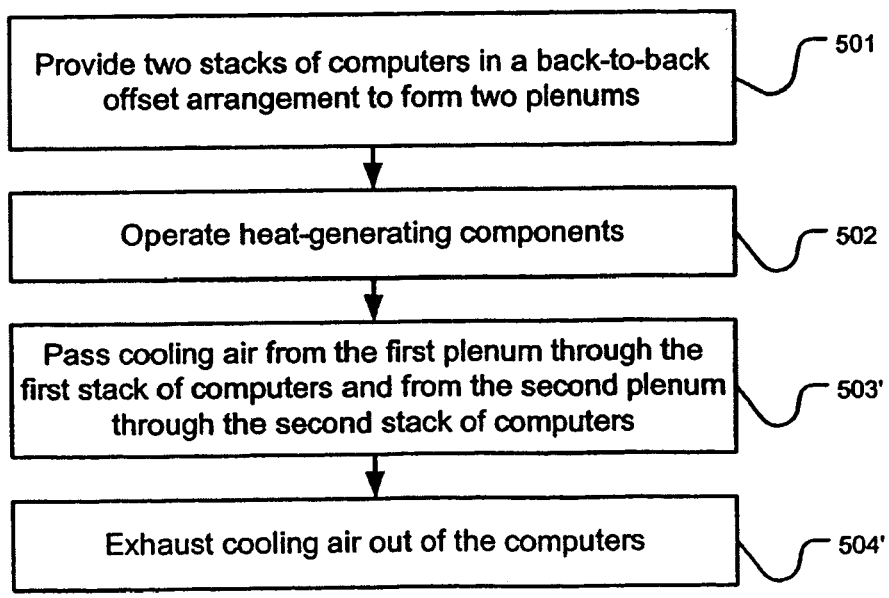

FIG. 5B shows a flowchart of an alternative computer system cooling method. In step 503' of this embodiment, cooling air is drawn from the two cooling air plenums into the computers to draw heat from the heat-generating components. This cooling air may be provided from the bottom of the plenum 110, from the top of the plenum 110, or from both. In addition, this cooling air may be forced air and/or may be air conditioned air. In step 504', the cooling air is exhausted out of the computers. Vents may be provided in the front sections of the computers to allow the cooling air to exhaust out of the computers.

In the above-described embodiments, the cooling air passes through each computer 104 in a front-to-back or back-to-front direction. In other words, in a front-to-back airflow system, the cooling air passes into vents provided in the front of the computer 104 and passes out through vents provided in the back of the computer 104. In other embodiments, the cooling air can be provided from the ducts beneath the computer room floor up into the plenums 110. This cooling air then passes into the back of the computers 104 and out of the front of computers 104 into the computer room.

Figure 6:
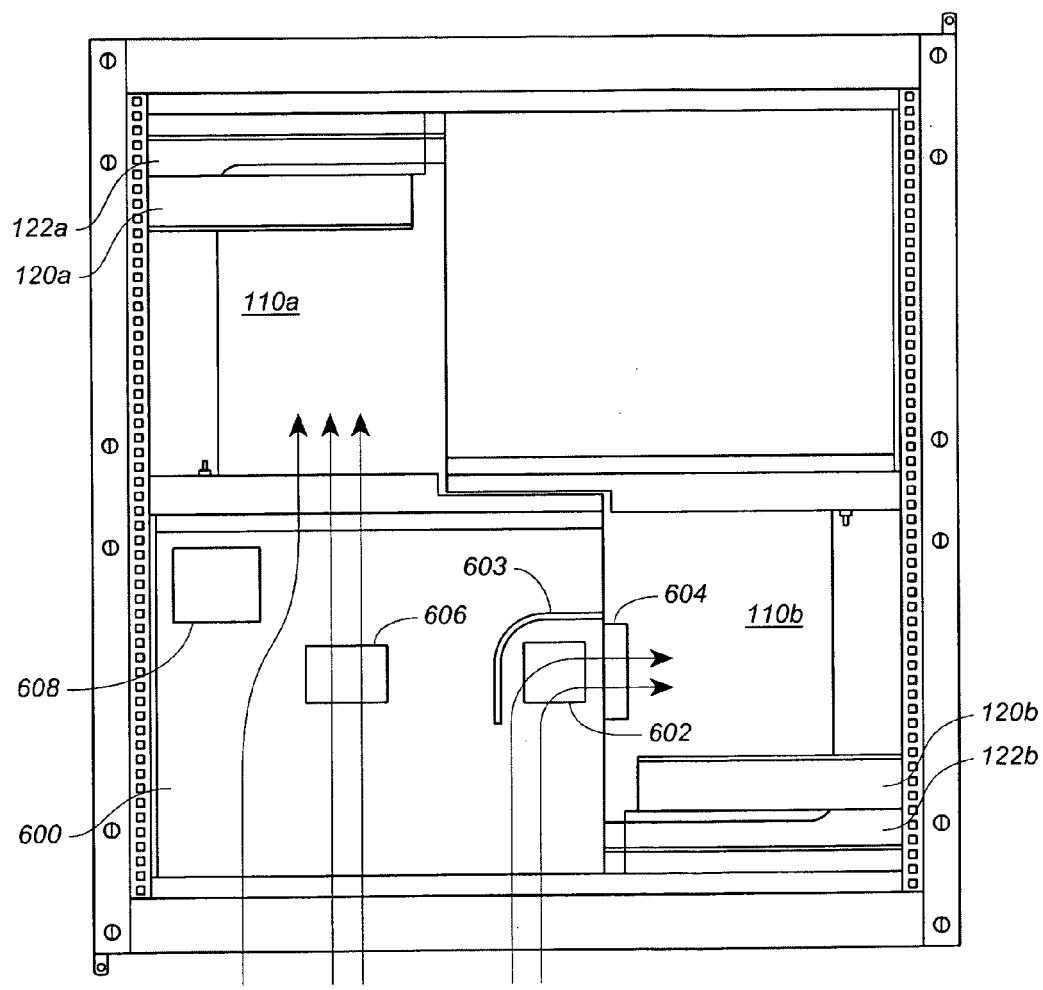
FIG. 6 is a top view showing the flow of cooling air in accordance with embodiments of the present invention.
Figure 7:
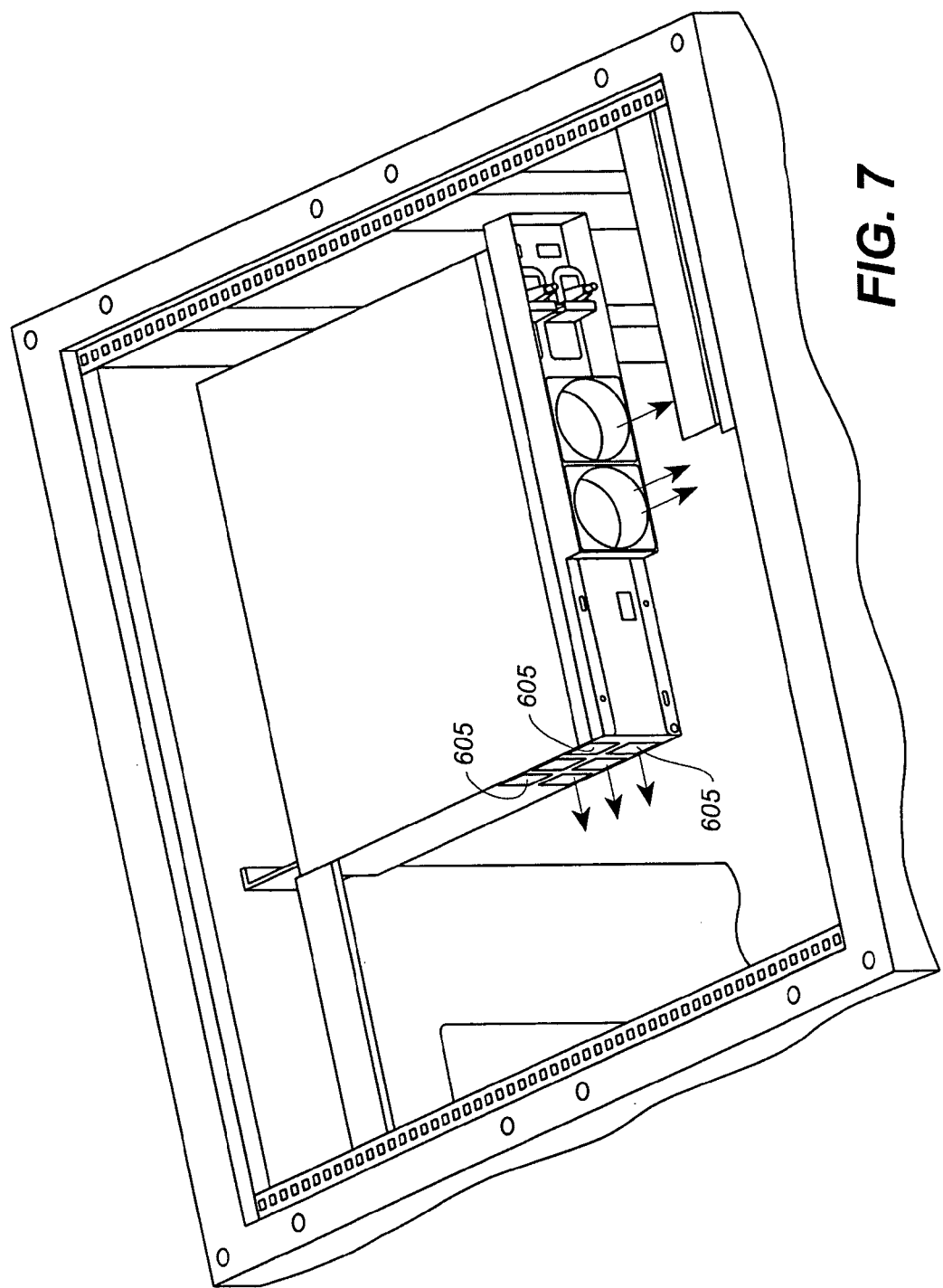
FIG. 7 is a perspective view showing the flow of cooling air in accordance with embodiments of the present invention.

In accordance with another aspect of the present invention, other directions of airflow are possible. FIGS. 6–7 show the airflow in a front-to-side airflow system in which air enters the computer 600 through vents provided in the front of the computer 600 and then flows out of the computer 600 through vents 605 provided on the side of the computer 600 which faces the second air plenum 110b. This front-to-side airflow can be used alone or in conjunction with the front-to-back airflow described above.

The use of both front-to-side and front-to-back airflow can be particularly useful to cool specific components of a computer 600. For example, a heat-generating component 602 may be provided near the side of the computer 600. This heat-generating component 602 may be one of the primary heat-generating components of the computer 600, such as one or more CPUs. In this situation, it may be desired to exhaust the cooling air immediately after the air passes over the CPU, thereby preventing the heated air from contacting the other heat-generating components 606, 608 in the computer 600. An airflow directing member 603 may be provided to help guide the air out of the side of the computer 600. An additional air mover 604 may be provided on the side of the computer to also assist with drawing the air out of the side of the computer 600. This exhaust air may be vented out of the top and/or bottom of the plenums 110a–110b. In other embodiments, the cooling air may be provided into the plenums 110a–110b, and the front-to-side airflow can be reversed to provide a side-to-front airflow, with the exhaust air being vented out of the front of the computers 600.

In various figures, to improve clarity, the number computers 104 which are shown in the figure may vary. In FIG. 3, for example, two computers 104a facing the first face side 106a and two computers 104b facing the second face side 106b are shown. It is to be understood that a variable number of computers 104 can be provided in each stack 105. To maximize the density of computers 104 in the computer system 100, it may be desired to fill the entire available vertical space in the computer rack 102 with computers 104.

As a result of the symmetrical layout of computers 104 in the computer systems 100, the conventional notions of the "front" and "back" of a computer rack do not apply. In conventional racks, the "front" side of the rack provides access to the faces of the computers. The front side access is typically necessary for removing components such as hot-swap hard drives or for removing an entire computer from the rack. The "back" side access is typically necessary for accessing the I/O inputs for the same computers.

In accordance with embodiments of the present invention, each computer system 100 includes a first face side 106a and a second face side 106b, each face side providing access to the front side of one of the stacks 105 of computers 104. The back side of the first stack 105a of computers 104a faces the back side of the opposing stack 105b of computers 104b. This back-to-back arrangement of stacks of computers can impede access to the back sides of the computers 104. Accordingly, in some embodiments, all of the components which must be accessible while the computers 104 are operating are provided on the front sides of the computers 104. These components include, for example, optional hard disk drives, removable media drives, and I/O connectors, such as serial ports, parallel ports, and RJ-45 ports. The components which are only accessed after the computers 104 are shut down are not accessed as often and can be provided in the back side of the computer 104. For example, the power connector can be provided on the back side because the power cable is typically not disconnected while the computer is still in operation.

Figure 8A:
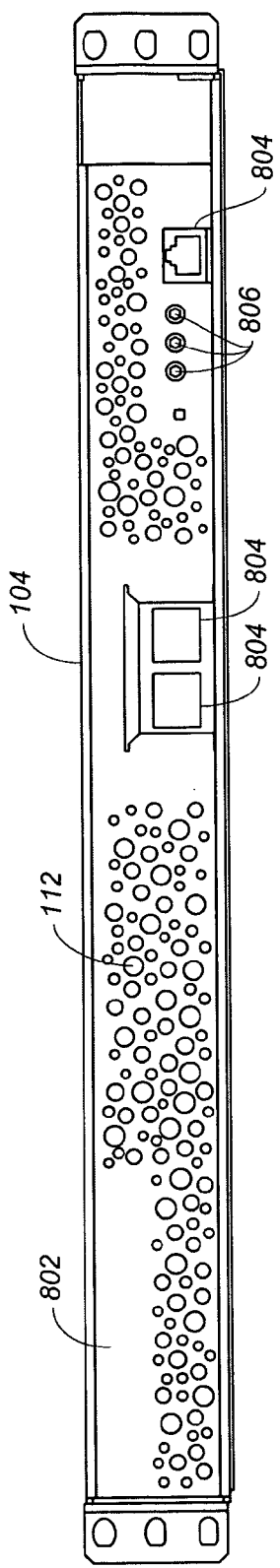
FIGS. 8A–8B are front and back views of a computer in accordance with embodiments of the present invention.
Figure 8B:
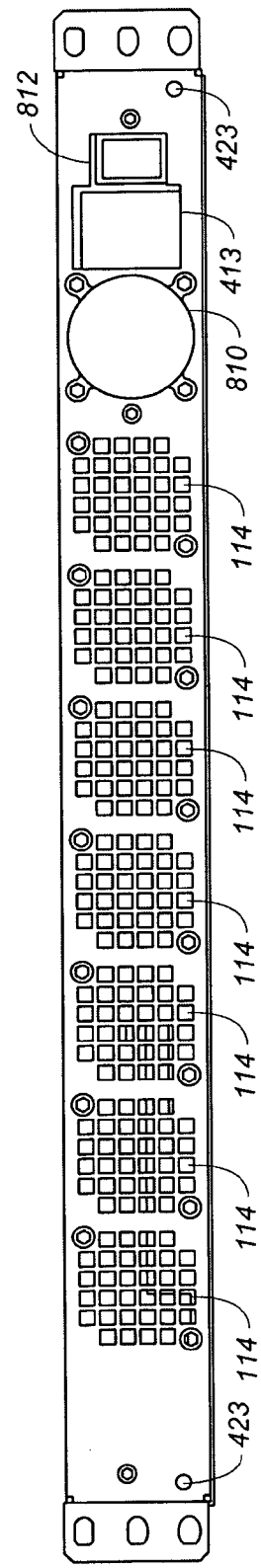

FIGS. 8A–8B show front and back sides of an exemplary computer 104 in accordance with the present invention. The front view shown in FIG. 8A shows a removable bezel 802 mounted to the front side of the computer 104. This bezel 802 may include apertures to enable cooling and/or exhaust air to flow from the vents 112 provided on the front of the computer 104. In other embodiments, the bezel 802 may be omitted. The bezel 802 may further include apertures 804 providing access to various I/O ports, such as, e.g., RJ45 connectors, and additional apertures 806 to provide a user with a view of indicators on the front of the computer 104. These indicators may be, e.g., LEDs indicating hard drive activity or other status information. The back side of the computer 104, as shown in FIG. 8B, may include a power supply fan guard cutout 810, which comprises a removable panel to expose an optional fan dedicated to the power supply in the computer 104. The back side may also include a power switch cutout 812 for providing access to an optional power switch on the back of the computer 104. In other embodiments, the power switch may be provided on the front side of the computer 104 or may be omitted altogether.

The back-to-back and offset pairs of computers 104 may be mounted in a standard-sized computer rack on slides (not shown). When no slide is used, each of the computers 104 may be supported by the computer 104 directly beneath it or may be supported using the support apertures 422 and support pins 423, as described above.

Reasons for providing sets of computers utilizing front-to-back airflow into and out of the plenums 110a–110b include, but are not limited to, maintaining an acceptable overall temperature of the environment in which the computers are housed, controlling environmental cooling or air-conditioning costs and providing a self-contained unit that may be individually vented so as to avoid contribution to an overall heating problem of a facility or exacerbating heating problems of nearby, less-robust systems by blowing hot air in their direction. To aid in providing a discrete system which will not contribute to overall heating problems at a site, further isolation of the system may be accomplished by providing insulation at, along or within the sides of the rack 102 and/or at any optional door(s) provided.

While the invention has been described in terms of particular embodiments and illustrative figures, those of ordinary skill in the art will recognize that the invention is not limited to the embodiments or figures described. For example, many of the embodiments described above refer to the computer systems being utilized as part of a server farm. In other embodiments, the computer systems may be used for other purposes, such as, for example, storage arrays. The multiple computers in a single stack may be identical or may be different. In some embodiments, the computers in a stack may have different form factors (e.g., some computers have a 1U profile, while others have a 2U or 3U profile) and may be configured to perform different tasks (e.g., one or more computers may be configured as a central controllers, while other computers in the stack may be configured as storage arrays).

Therefore, it should be understood that the invention can be practiced with modification and alteration within the spirit and scope of the appended claims. The description is thus to be regarded as illustrative instead of limiting on the invention.

We claim:

1. A computer system, comprising:
   a computer rack;
   a first stack and a second stack provided in the computer rack, each stack comprising one or more computers;
   a first cooling plenum configured such that cooling air can flow between the computers in the first stack and the first cooling plenum; and
   a second cooling plenum configured such that cooling air can flow between the computers in the second stack and the second cooling plenum;
   wherein the first stack and the second stack are positioned such that a partially overlapping portion of the back side of the first stack faces a partially overlapping portion of the back side of the second stack, an exposed portion of the first stack faces the first cooling plenum, and an exposed portion of the second stack faces the second cooling plenum.

2. The computer system of claim 1, further comprising:
   a first bracket disposed between the first stack and the first cooling plenum and configured to allow cooling air to flow between the first stack and the first cooling plenum; and a second bracket disposed between the second stack and the second cooling plenum and configured to allow cooling air to flow between the second stack and the second cooling plenum.

3. The computer system of claim 2, wherein the first bracket further comprises:
a fan configured to force air from more than one computer in the first stack into the first cooling plenum or configured to force air from the first cooling plenum into more than one computer in the first stack.

4. The computer system of claim 2, wherein the first bracket further comprises:
a power interface configured to couple with a power interface on one of the computers in the first stack when the computer is inserted into the computer rack.

5. The computer system of claim 4, further comprising:
a power supply disposed external to the computers in the first stack and coupled to the power interface.

6. The computer system of claim 1, wherein:
each computer in the first stack is in fluid communication with the first cooling plenum through a back side of the computer and with the second cooling plenum through a lateral side of the computer.

7. The computer system of claim 1, further comprising:
an exhaust duct coupled to the first cooling plenum for channeling cooling air from the computer rack to a location exterior to the site where the computer rack is located.

8. The computer system of claim 1, further comprising:
an air conditioning system for supplying cooling air to the computer rack.

9. A computer system, comprising:
a computer rack comprising a first region configured to retain a first stack of computers and a second region configured to retain a second stack of computers adjacent to the first stack of computers such that a first cooling plenum is in fluidic communication with computers disposed in the first stack of computers and a second cooling plenum is in fluidic communication with computers disposed in the second stack of computers;
wherein the computer rack is configured to hold the first stack of computers such that a partially overlapping portion of the first stack of computers faces a partially overlapping portion of the second stack of computers and an exposed portion of the first stack of computers faces the first cooling plenum and an exposed portion of the second stack of computers faces the second cooling plenum.

10. The computer system of claim 9, wherein:
the computer rack comprises a first access side and a second access side opposite the first access side such that the first region and the second cooling plenum are disposed adjacent the first access side and the second region and the first cooling plenum are disposed adjacent the second access side.

11. A method of operating a plurality of computers in a computer rack, comprising:
providing a first and a second computer in a partial back-to-back relationship in the computer rack such that an overlapping portion of the back of the first computer faces an overlapping portion of the back of the second computer;
passing cooling air through the first computer and out of an exposed portion of the back of the first computer and into a first cooling plenum or passing cooling air from the first cooling plenum into the first computer; and
passing cooling air through the second computer and out of an exposed portion of the back of the second computer and into a second cooling plenum or passing cooling air from the second cooling plenum into the second computer.

12. The method of claim 11, wherein said providing the first and second computers comprises providing a first stack of computers and a second stack of computers such that each computer in the first stack of computers has an overlapping portion facing an overlapping portion of the back of the a computer in the second stack of computers.

13. The method of claim 11, wherein:
the first cooling plenum is defined by the exposed portion of the back of the first computer, a first side of the second computer, and the computer rack; and
the second cooling plenum is defined by the exposed portion of the back of the second computer, a first side of the first computer, and the computer rack.

14. A computer system, comprising:
a support structure configured to support a first stack of computers and a second stack of computers in an offset back-to-back configuration.

15. The computer system of claim 14, further comprising:
a first stack of computers provided in the support structure; and
a second stack of computers provided in the support structure.

16. The computer system of claim 14, wherein:
the support structure comprises a computer rack and a plurality of computer chassis support brackets positioned in a central portion of the computer rack and configured to support the first stack of computers on a first side of the computer chassis support brackets and to support the second stack of computers on a second side of the computer chassis support brackets.

17. The computer system of claim 16, wherein:
the computer chassis support brackets are further configured to support a first plurality of fans for moving air into or out of the first stack of computers and a second plurality of fans for moving air into or out of the second stack of computers.

18. The computer system of claim 16, wherein:
the computer chassis support brackets are further configured to support a first plurality of power connectors for connection with the first stack of computers and a second plurality of power connectors for connection with the second stack of computers.

19. A computer system, comprising:
a computer rack;
a first stack and a second stack provided in the computer rack, each stack comprising one or more computers;
a first cooling plenum configured such that cooling air can flow between the computers in the first stack and the first cooling plenum; and
a second cooling plenum configured such that cooling air can flow between the computers in the second stack and the second cooling plenum;
wherein:
the first cooling plenum is defined by an exposed portion of the back of the first stack, a first side of the second stack, and the computer rack; and
the second cooling plenum is defined by an exposed portion of the back of the second stack, a first side of the first stack, and the computer rack.

* * * * *